United States Patent [19]

Shinohara et al.

[11] Patent Number: 5,406,332
[45] Date of Patent: Apr. 11, 1995

[54] PHOTOELECTRIC CONVERTING DEVICE

[75] Inventors: Mahito Shinohara, Tokyo; Isamu Ueno, Hadano; Hidekazu Takahashi, Atsugi, all of Japan

[73] Assignee: Canon Kabushiki Kaisha, Tokyo, Japan

[21] Appl. No.: 26,011

[22] Filed: Mar. 4, 1993

[30] Foreign Application Priority Data

Mar. 6, 1992 [JP] Japan .................. 4-083058

[51] Int. Cl.$^6$ .................. H04N 5/335; H04N 3/12
[52] U.S. Cl. ....................... 348/308; 348/243; 348/241; 257/291; 257/443; 250/208.1
[58] Field of Search .......... 358/212, 213.11, 213.27, 358/213.31; 250/578, 208.1; 257/291, 292, 443, 461, 462, 448; 357/30; H04N 5/335

[56] References Cited

U.S. PATENT DOCUMENTS

| | | | |
|---|---|---|---|
| 4,737,832 | 4/1988 | Kyuma | 357/30 |
| 4,791,469 | 12/1988 | Ohmi et al. | 357/30 |
| 4,794,443 | 12/1988 | Tanaka et al. | 357/43 |
| 4,810,896 | 3/1989 | Tanaka et al. | 250/578 |
| 4,831,454 | 5/1989 | Tanaka et al. | 358/213.31 |
| 4,847,668 | 7/1989 | Sugawa et al. | 357/30 |
| 4,849,470 | 7/1989 | Murphy | 524/714 |
| 4,866,293 | 9/1989 | Nakamura et al. | 250/578 |
| 4,868,405 | 9/1989 | Nakamura | 250/578 |
| 4,922,138 | 5/1990 | Hashimoto et al. | 307/482 |
| 4,959,723 | 9/1990 | Hashimoto | 358/213.11 |
| 4,962,412 | 10/1990 | Shinohara et al. | 357/30 |
| 5,008,206 | 4/1991 | Shinohara et al. | 437/3 |
| 5,060,042 | 10/1991 | Shinohara et al. | 257/292 |
| 5,146,339 | 9/1992 | Shinohara et al. | 358/212 |

FOREIGN PATENT DOCUMENTS

| | | | |
|---|---|---|---|
| 0277016 | 8/1988 | European Pat. Off. | H01L 27/14 |
| 0433007 | 6/1991 | European Pat. Off. | H01L 31/00 |
| 0473294 | 3/1992 | European Pat. Off. | H01L 27/146 |

OTHER PUBLICATIONS

"Design of Bipolar Imaging Device (BASIS)" by Yoshio Nakmaura et al. IEEE Transactions on Electron Devices; vol. 38, No. 5, May 1991, N.Y. USA; pp. 1028–1036.

"A New Device Architecture Suitable for High-Resolution and High-Performance Image Sensors", by J. Hynecek; Electron Devices; vol. 35, No. 5; May 1988; pp. 646–652.

"A 310K Pixel Bipolar Imager (BASIS)" by N. Tanaka et al. Electron Devices; vol. 37, No. 4, Apr. 1990; pp. 964–971.

*Primary Examiner*—Michael T. Razavi
*Assistant Examiner*—Andy Christensen
*Attorney, Agent, or Firm*—Fitzpatrick, Cella, Harper & Scinto

[57] ABSTRACT

A photoelectric converting device is provided with a control electrode area consisting of a semiconductor of a first conductive type, first and second main electrode areas consisting of a semiconductor of a second conductive type different from the first conductive type, and a drive line capacitively coupled to the control electrode area for controlling the potential thereof, and adapted to read a signal from the first main electrode area, by the potential control of the control electrode area, based on a charge generated by an incident light energy and accumulated in the control electrode area. The potentials of the first main electrode areas and of the drive line are elevated during the light signal accumulating operation to elevate the potential of the control electrode area, thereby rendering the potential difference between the control electrode area and the second main electrode area smaller than at the end of charge resetting of the control electrode area.

2 Claims, 14 Drawing Sheets

PHOTOELECTRIC CONVERTING DEVICE

BACKGROUND OF THE INVENTION

1. Field of the Invention

The present invention relates to a photoelectric converting device adapted for use in an image input device in a camcorder, an image scanner, a facsimile machine, an auto focusing device or the like.

2. Related Background Art

In the field of photoelectric converting devices, in consideration of the decrease in the photoelectrically converted output signal resulting from the increase in the number of pixels of such devices, amplifying photoelectric converting devices, capable of amplifying the photoelectrically converted signal, are recently attracting attention. Among such amplifying devices, there is known a photoelectric converting device of which structure is similar to the bipolar or unipolar transistor and which accumulates a charge, generated by light irradiation, in the base area or in the gate area constituting a control electrode area and releases an amplified signal from the emitter or source area constituting a main electrode area (such device being hereinafter called amplifying sensor).

Such photoelectric converting device is disclosed, for example, by "A 310K Pixel Bipolar Imager (BASIS)", IEEE Transactions on Electron Devices, Vol. 37, No. 4, April 1990, pp 964–971, and by "A New Device Architecture Suitable for High-Resolution and High-Performance Image Sensors", IEEE Transactions on Electron Devices, Vol. 35, No. 5, May 1988, pp 646–652.

FIG. 16 is a plan view of a pixel employing a conventional bipolar transistor sensor, wherein shown are an emitter area (constituting a first main electrode area) 1; an output line 2 composed for example of aluminum; a contact hole 3 for connecting the emitter area 1 with the output line 2; a base area (constituting a control electrode area) 4 for accumulating photoinduced charge; a drive line 5 composed for example of polysilicon for effecting the sensor operation of the pixel; an electrode 6 forming a capacitance $C_{OX}$ between the base area 4 and the drive line 5; a gate (control) electrode 7, formed in a part of the drive line 5, of a p-MOS transistor (indicated by a broken-lined area M in FIG. 17) of which source and drain areas are composed of the base areas of the adjacent pixels; and a thick oxide film (field oxide film) 8 for separating pixels.

FIGS. 17 and 18 are cross-sectional views respectively along lines X–X' and Y–Y' in FIG. 16. In FIGS. 17 and 18 there are shown a thin oxide film 9; an n+ layer 10 of a high impurity concentration for device isolation, for separating the pixel signals in the Y–Y' direction; an n− layer 11 of a low impurity concentration in which the depletion layer is to spread; a collector area 12 (constituting a second main electrode area); and an interlayer insulation film 13 for separating the wirings 2, 5.

As shown in FIG. 17, a resetting p-MOS transistor M (indicated by a broken-lined circle) is formed in the horizontal separating area between the pixels. When the gate of said p-MOS transistor is turned on, the base areas 4 of two pixels adjacent along the X–X' direction are connected, whereby resetting is achieved. When the gate is turned off, the p-MOS transistor M serves as the pixel separating means.

FIG. 19 is an equivalent circuit diagram of the photoelectric converting device mentioned above. In FIG. 19, a pixel 21 is represented as composed of a bipolar phototransistor T, a capacitance $C_{OX}$ connected to the base, and a p-MOS transistor M. There are also shown vertical output lines 22 connected to the emitters of the pixels 21; MOS transistors 23 for resetting the vertical output lines 22; accumulating capacitances 24 for accumulating the output signals from the pixels 21; MOS transistors 25 for transferring the output signals to the accumulating capacitances 24; MOS transistors 26 for transferring the output signals to a horizontal output line 27 in response to output signals of a horizontal shift register; a MOS transistor 28 for resetting the horizontal output line 27; a pre-amplifier 29; horizontal drive lines 30; buffer MOS transistors 31 for passing sensor drive pulses in response to the output of a vertical shift register; an emitter-follower circuit 32 for setting the source potential of the p-MOS transistors in order to effect clamping operations of the pixels 21; a p-MOS transistor 33 for setting the base potential of the emitter-follower circuit 32; a terminal 34 for applying a pulse to the gates of the MOS transistors 23; a terminal 35 for applying a pulse to the gates of the MOS transistors 25; a terminal 36 for applying sensor drive pulses; a terminal 37 for applying a pulse to the gate of the p-MOS transistor 33; and an output terminal 38 connected to the pre-amplifier 29.

The two-dimensional solid-state image pickup device shown in FIG. 19 is of a type in which all the pixels can be reset at a time, and is preferably applied for example in a still video camera.

Next the function of the above-discussed device will be explained. The function of the two-dimensional solid-state image pickup device consists of a resetting operation, an accumulating operation, and a read-out operation, and the resetting operation is composed of a first resetting and a second resetting.

FIG. 20 shows the potential change in various parts of the bipolar sensor in those operations, wherein shown are the potential $\phi_R$ of the horizontal drive line 30, base potential $V_B$ of the bipolar transistor, and emitter potential $V_E$ of the bipolar transistor T:

1. Resetting operation (1) First resetting

The first resetting ($t_c$–$t_d$ in FIG. 20) is to turn on the resetting p-MOS transistor M, thereby bringing the base area to a predetermined potential.

At first a low-level pulse is applied to the terminal 37 shown in FIG. 19, thereby turning on the p-MOS transistor 33 to shift the output of the emitter-follower circuit 32 to a positive potential. That output is supplied to the source of the p-MOS transistor M of each pixel, and, if the source potential becomes high enough, in comparison with the gate potential $\phi_R$, for turning on the p-MOS transistor M, holes are injected through the p-MOS transistor to the base of the bipolar transistor T of each pixel.

Then a high-level pulse is applied to the terminal 37 to turn off the p-MOS transistor 33, thereby shifting the output of the emitter-follower circuit 32 to the ground potential.

(2) Second resetting:

The second resetting ($t_d$–$t_e$ in FIG. 20) shifts $\phi_R$ to a positive potential while maintaining the emitter of the bipolar transistor T in grounded state. In this state the base potential $V_{b1}$ is elevated to:

$$V_{b1} = C_{OX}/(C_{OX} + C_{BC} + C_{BE}) \times V_R$$

wherein $C_{BC}$ is the base-collector capacitance, $C_{BE}$ is the base-emitter capacitance, and $V_R$ is the amplitude voltage of $\phi_R$. In this state a forward bias is applied between the base and the emitter, and the base potential is lowered by the recombination of electron and positive holes. Subsequently the potential $\phi_R$ is returned to the ground potential, and an inverse bias is applied between the base and the emitter to initiate the next accumulating operation.

More specifically, a high-level pulse is applied to the terminal 34 shown in FIG. 19 to turn on the transistors 23 thereby grounding the vertical output lines 22. In this state the vertical shift register is activated and reset pulses are applied to the terminal 36, thereby resetting the pixels in successive rows. In this manner the bases of the bipolar transistors T of all the pixels are brought to a predetermined potential in an inversely biased state, in preparation for the next accumulating operation.

2. Accumulating operation

The accumulating operation starts at the completion of the above-explained resetting operation ($t_a$ in FIG. 20), when an inverse bias is applied between the base and the emitter of the bipolar transistor T. The base potential is elevated as the positive holes, generated by the incident light in the depletion layer between the base and the collector, are accumulated in the base area.

3. Read-out operation

The emitter of the bipolar transistor T is left floating, and the potential $\phi_R$ is shifted to a positive value to elevate the base potential by the capacitance coupling through $C_{OX}$ to create a forward bias state between the base and the emitter, whereby the read-out operation is initiated ($t_b$ in FIG. 20). As the potential of the emitter, connected to a capacitative load, reaches a certain potential difference to the base potential at the end of the read-out operation ($t_c$ in FIG. 20), the variations ($V_{P1}$, $V_{P2}$) in the base potential at the accumulating operation appear on the emitter terminal.

More specifically, a low-level pulse is applied to the terminal 34 shown in FIG. 19 to turn off the MOS transistors 23, and, for each row selected by the output of the vertical shift register, a read-out pulse is supplied from the terminal 36 to accumulate the output signals in the accumulating capacitances 24 through the MOS transistors 25. Thus accumulated output signals are subsequently transferred to the horizontal output line 27 through the transfer MOS transistors 26 selected in succession by the horizontal shift register, and released from the output terminal 38 through the pre-amplifier 29.

In the conventional amplifying sensor explained above, since the output of the sensor is inversely proportional to the capacitance of the sensor cell, it is desirable to widen the depletion layer between the base and the collector and to reduce the base-collector capacitance. However, since such configuration enhances the dark current generated from the depletion layer between the base and the collector, the fluctuation in the dark currents in the sensor cells has been a cause of the fixed pattern noise (FPN), and this is a first drawback to be resolved in the present invention.

Also in the conventional amplifying sensor explained above, capacitative coupling with the base area is provided by the MOS capacitance ($C_{OX}$) utilizing a polysilicon electrode formed on the base. Such configuration leads to the following additional drawbacks:

(1) a lowered blue light sensitivity due to the formation of the polysilicon electrode on the aperture where incident light enters;
(2) an increased dark current due to the depletion of the interface between the oxide film under the polysilicon electrode and the base area; and
(3) an increased fluctuation of the capacitance $C_{OX}$, leading to fixed pattern noise, because of the fluctuation in the precision of the polysilicon electrode which is prepared in a non-self aligned process.

SUMMARY OF THE INVENTION

An object of the present invention is to provide a photoelectric converting device with improved fixed pattern noise reduction capability.

Another object of the present invention is to provide a photoelectric converting device capable of varying the spreading of the depletion layer, through control of the inverse bias amount of the control electrode area.

Still another object of the present invention is to provide a photoelectric converting device with a reduced fluctuation in the capacitances among the pixels, by forming an electrode for applying the bias voltage at the read-out operation and a control electrode superposed thereon by a self-aligned process.

The above-mentioned objects can be attained, according to the present invention, by a photoelectric converting device having a plurality of photoelectric converting cells each including a rectifying junction, comprising means for rendering the inverse bias amount of said rectifying junction smaller than that immediately after the resetting operation.

Also the above objects can be attained, according to the present invention, by a photoelectric converting device containing an array of plural photoelectric converting cells each having a first semiconductor area of a first conductive type and a second semiconductor area of a second conductive type, and an electrode provided corresponding to at least two adjacent first semiconductor areas and adapted to receive a signal of at least three voltage levels;

wherein the electrode and the at least two adjacent first semiconductor areas are self aligned to constitute a superposed capacitance by the self-aligned part alone, and the potential of said first semiconductor areas is controlled by means of said capacitance to effect an accumulating operation, a read-out operation and a resetting operation.

Also these objects can be attained by a photoelectric converting device having a control electrode area composed of a semiconductor of a first conductive type, first and second main electrode areas of a semiconductor of a second conductive type different from said first conductive type, and a drive line which is capacitance coupled to the control electrode area for controlling the potential of said control electrode area, and adapted to read out a signal from the first main electrode area based on a charge generated by an incident light energy and accumulated in the control electrode area and through the control of the potential of the control electrode area, comprising:

means for elevating, during the accumulation of the light signal, the potentials of the first main electrode area and of the drive line to elevate the potential of the control electrode area, thereby rendering the potential difference between the control electrode area and the second main electrode area smaller than that at the completion of resetting of said control electrode area.

Also these objects can be attained by a photoelectric converting device having a control electrode area composed of a semiconductor of a first conductive type, first and second main electrode areas of a semiconductor of a second conductive type different from said first conductive type, and a drive line which is capacitance coupled to said control electrode area for controlling the potential of said control electrode area, and adapted to read out a signal from said first main electrode area based on a charge generated by an incident light energy and accumulated in said control electrode area and through the control of the potential of the control electrode area, comprising:

first voltage applying means for providing the drive line with a signal switchable between a first voltage and a second voltage larger than the first voltage, and second voltage applying means for providing the drive line with a third voltage of a level between said first and second voltages, wherein voltages of three values are given by the first and second voltage applying means to the drive line to reset the charge in the control electrode area, then the drive line is set at the third voltage at the completion of resetting, and the drive line is maintained at the third voltage during the light signal accumulating operation.

Also the above objects can be attained by a photoelectric converting device having a plurality of photoelectric converting elements each including a control electrode area of a semiconductor of a first conductive type and a main electrode area of a semiconductor of a second conductive type different from the first conductive type, and adapted to read a signal from the main electrode area based on a charge generated by an incident light energy and accumulated in the main electrode area, through the control of the potential of the control electrode area, wherein a control electrode is formed, across an insulating film, on a semiconductor area between two control electrode areas of the adjacent photoelectric converting elements to form a gate-insulated transistor, and the control electrode and at least one of said two control electrode areas are capacitance coupled whereby the potential of the control electrode area is controlled by the potential control of the control electrode.

DETAILED DESCRIPTION OF THE PREFERRED EMBODIMENTS

Figure 1:
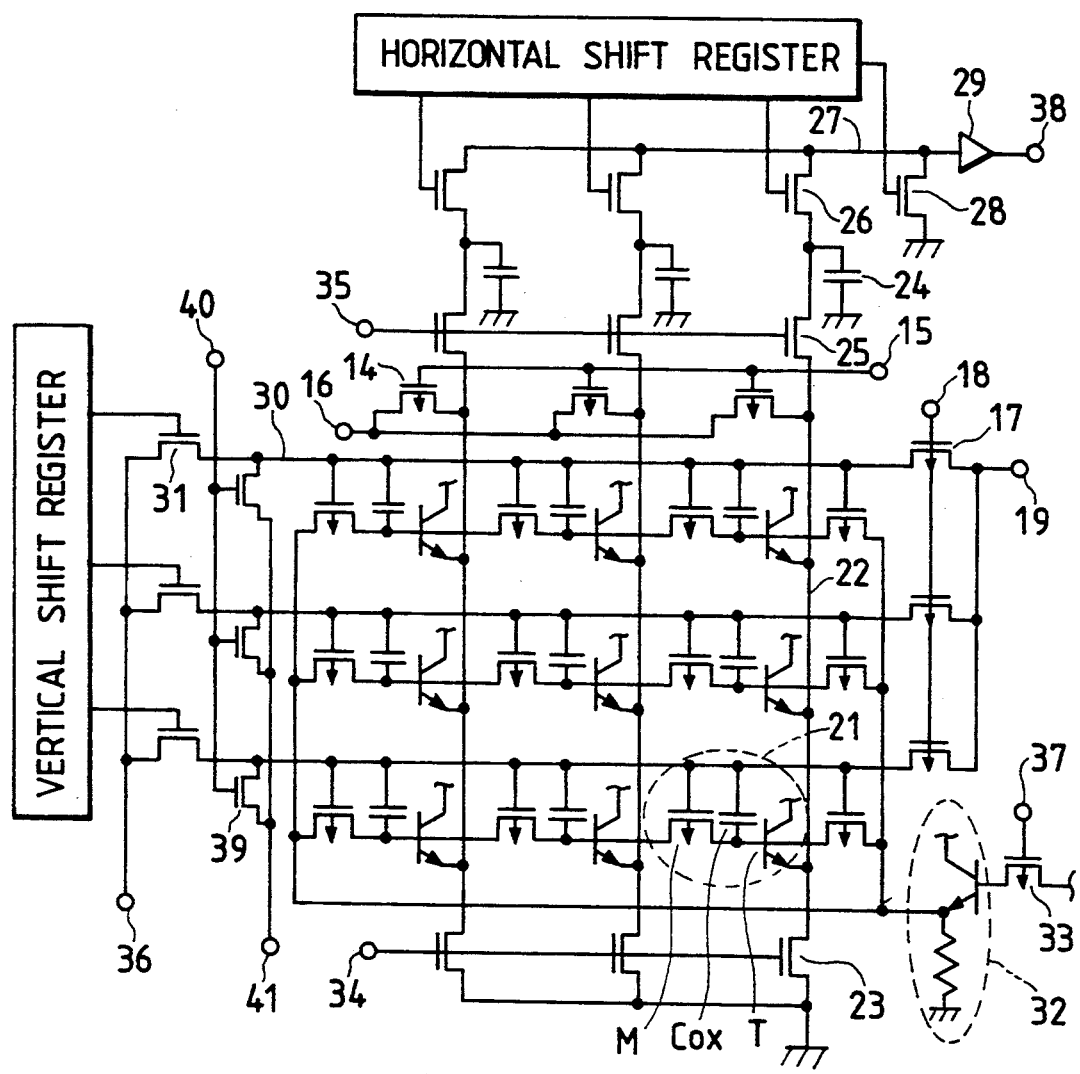
FIG. 1 is an equivalent circuit diagram of a first embodiment of the solid-state image pickup device of the present invention.

The present invention is to reduce the fixed pattern noise resulting from the dark current, by regulation of the inverse bias amount in the rectifying junction in the photoelectric converting device.

Also the present invention is to form an electrode between at least two adjacent semiconductor areas thereby forming an overlapping capacitance between the electrode and the at least two semiconductor areas by a self-aligning process and thus aligning the edge portion of the electrode with that of the semiconductor areas, and applying a signal having at least voltage levels to the electrode thereby effecting an accumulating operation, a read-out operation and a refreshing operation. The rectifying junction to be employed in the present invention can be a PN junction, a PI junction, a PIN junction or a Shottky junction, and, more specifically, the photoelectric converting cell is made of a diode or a bipolar transistor. In case of the bipolar transistor, the base-collector junction is used as the PN junction. It is also possible to form the cell by a junction field effect transistor or a static induction transistor, and to utilize the gate-channel junction or the gate-drain junction thereof as the PN junction.

The following embodiments employ a photoelectric converting cell utilizing a bipolar transistor, and the basic configuration and function of such cell are disclosed in the U.S. Pat. No. 4,791,469 entitled "photoelectric converter" awarded to the inventors Ohmi and Tanaka. Besides they are detailedly described, for example, in the U.S. Pat. Nos. 4,799,443, 4,831,454, 4,847,668, 4,810,896, 4,868,405, 4,866,293, 4,737,832, 4,879,470, 4,922,138, 4,959,723, and 4,962,412.

On the other hand, an embodiment of the present invention is featured in that the potentials of the first main electrode area and the drive line are elevated during the light signal accumulating operation thereby elevating the potential of the control electrode area, and that the potential difference between the control electrode area and the second main electrode area is made smaller than that at the end of resetting of the control electrode area, or namely the potential of the control electrode area is made close to that of the second main electrode area, whereby the width of the depletion layer between the control electrode area and the second main electrode area is reduced.

Also another embodiment of the present invention is featured in that a first voltage, a second voltage larger than the first voltage, and a third voltage of a level between the first and second voltages are suitably applied to the drive line to reset the charge in the control electrode area, then to set the drive line at the third voltage before the completion of resetting thereby setting the control electrode area at a high potential, and to set the drive line at the third voltage during the light signal accumulating operation, whereby the potential of the control electrode area is made close to that of the second main electrode area and the width of the depletion layer between the control electrode area and the second main electrode area is reduced.

Such reduction in the width of the depletion layer between the control electrode area and the second main electrode area allows reduction of the fixed pattern noise due to the dark current, thereby improving the S/N ratio without sacrificing the sensitivity.

Also, another embodiment of the present invention is featured in that the photoelectric converting element is driven by a capacitance $C_{GC}$ formed by the control electrode of the gate-insulated resetting transistor and the control electrode area of the pixel area, whereby the capacitance $C_{OX}$ formed on the control electrode area in the prior art device can be eliminated and a high S/N ratio can be attained in the sensor.

In the following embodiments, the basic configuration of the bipolar sensor constituting the pixel and the basic function thereof are same as those already explained in relation to FIGS. 16 to 20. The following description will therefore concentrate on the features of the present invention, and the description of other components will be omitted.

Embodiment 1

FIG. 1 is an equivalent circuit diagram of a first embodiment of the solid-state image pickup device of the present invention.

In FIG. 1 there are shown MOS transistors 14 for controlling the potentials of vertical output lines 22; a terminal 15 for applying a pulse to the gates of the MOS transistors 14; a power supply terminal 16 connected to the sources of the MOS transistor 14 and providing a reference voltage; MOS transistors 17 for controlling the potentials of horizontal drive lines 30; a terminal 18 for applying a pulse to the gates of the MOS transistors 17; a power supply terminal 19 connected to the sources of the MOS transistors 17 and providing a reference voltage; MOS transistors 39 for controlling the potentials of horizontal drive lines 30; a terminal 40 for applying a pulse to the gates of the MOS transistors 39; and a power supply terminal 41 connected to the sources of the MOS transistors 39 and providing a reference voltage.

Figure 2:
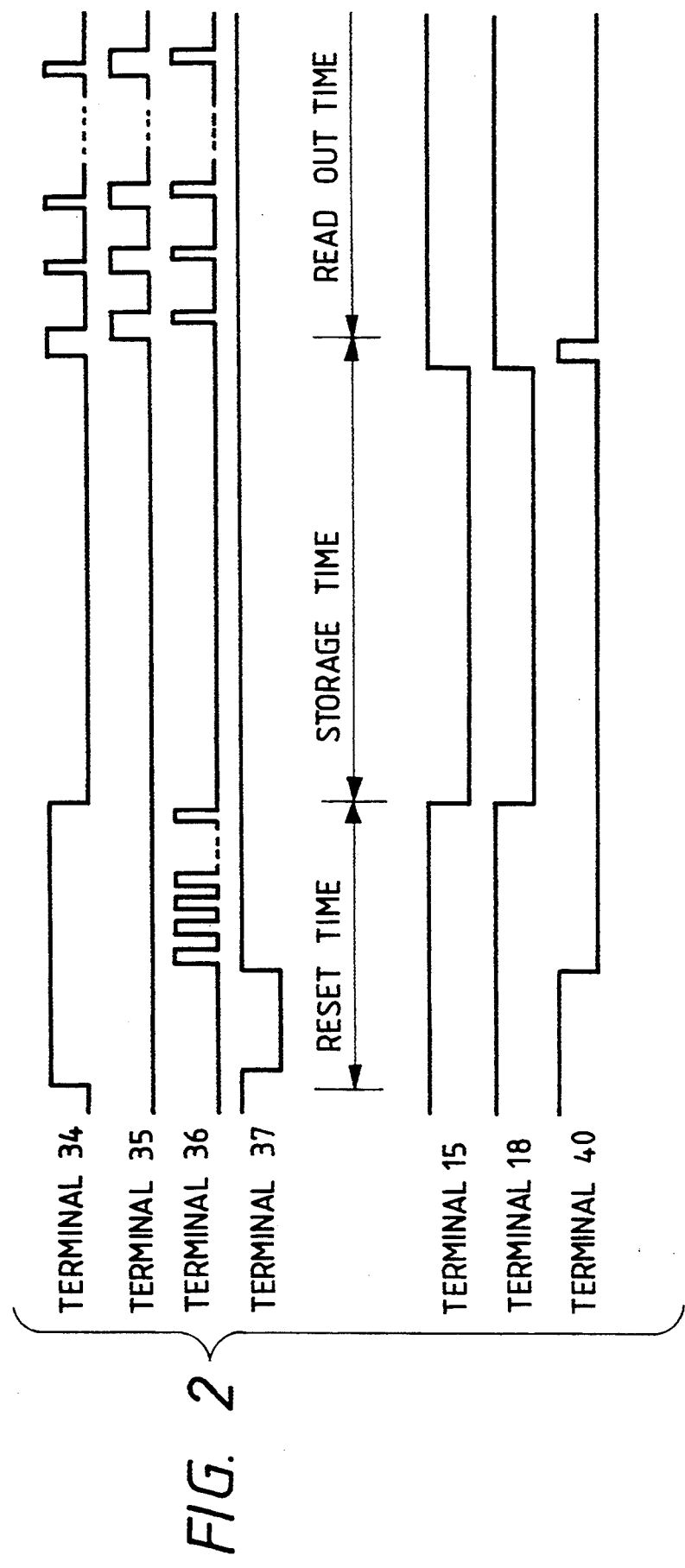
FIG. 2 is a timing chart showing pulses required for driving the solid-state image pickup device of said first embodiment.

FIG. 2 is a timing chart showing pulses supplied to various terminals for driving the above-explained solid-state image pickup device, wherein it is assumed that the MOS transistors 14, 17, 33 are p-MOS transistors to be turned on when the gate is at the low level state, while the MOS transistors 23, 25, 39 are n-MOS transistors to be turned on when the gate is at the high level state.

It is also assumed that the power supply terminals 16, 19 are given high level potentials while the terminal 36 is given a low level potential. The pulses to be supplied to the terminals 34, 35, 36, 37 will not be explained further as they were already explained in relation to a conventional configuration shown in FIG. 19.

Resetting operation

At first a high level pulse is applied to the terminal 34 to turn on the n-MOS transistors 23, thereby grounding the vertical lines and the emitters of the bipolar transistors. As a high level pulse is simultaneously applied to the terminal 40, the n-MOS transistors 39 are turned on to provide the horizontal drive lines with a pulse for turning on the p-MOS transistors M of the pixels. Immediately after the n-MOS transistors 23 are turned on, a low level pulse is applied to the terminal 37. Thus the p-MOS transistors M of the pixels are turned on, and the reference voltage for base resetting is supplied through the emitter-follower circuit 32 to set the bases of all the pixels to the reference potential (first resetting step).

Then the terminals 37 and 40 are respectively given a high level pulse and a low level pulse, whereby the p-MOS transistors M of the pixels are turned off and the bases of the pixels are maintained in a floating state.

Then the reference voltage pulse is supplied to the terminal 36, in synchronization with the shift pulses of the vertical shift register, whereby a high level pulse is applied to the horizontal drive lines in succession. Thus the bases of the bipolar transistors T of the pixels are forward biased to the emitters, by the pulse applied through the capacitance $C_{OX}$. Thus, by means of the recombination with the electrons injected into the bases through the emitters and the flow of holes from the bases to the emitters, the base potentials are reset to an initial state (second resetting step).

Accumulating operation

In the accumulating period, from a state in which the MOS transistors 23, 39 are turned off by the low level pulses supplied to the terminal 34, 40 to maintain the vertical output lines 22 and the horizontal drive lines 30 in a floating state, the pulses supplied to the terminals 15, 18 are simultaneously shifted to the low level state to turn on the p-MOS transistors 14, 17 thereby shifting the vertical output lines 22 and the horizontal drive lines 30 to the high level state. In this state, since the base potential is elevated by the capacitative coupling through the capacitance $C_{OX}$ and the base-emitter capacitance $C_{BE}$, the base-collector inverse bias potential difference $V_{BC}$ becomes smaller than in the prior configuration. For this reason the dark current generated from the depletion layer between the base and the collector becomes smaller, and the fixed pattern noise resulting from the fluctuation in the dark current among the cells becomes accordingly smaller. Immediately before the end of the accumulating period, the MOS transistors 14, 17 are once turned off to shift the vertical output lines 22 and the horizontal drive lines 30 to the floating state, and then the terminals 34, 40 are shifted to the high level state to turn on the n-MOS transistors 23, 39 thereby returning the vertical output lines 22 and the horizontal drive lines 30 to the state at the end of the resetting operation.

In the above-explained operations, for the accumulation of photo-generated charge, the (base thickness)+(- thickness of depletion layer between base and collector) only requires about 2 μm as far as the visible light is concerned, and the resetting and read-out operations are the same as in the prior art, so that the visible sensitivity is the same as in the conventional device. Consequently the fixed pattern noise based on the dark current is reduced and the S/N ratio can be improved.

Read-out operation

While a high level pulse is supplied to the terminal 34, a high level pulse is supplied to the terminal 35 to turn on the n-MOS transistors 25 thereby grounding the capacitances 24. Subsequently the terminal 34 is shifted to the low level state to turn off the n-MOS transistors 23, thereby connecting the emitters of the pixels to the capacitances 24 and maintaining them in a floating state. Then the read-out reference voltage is supplied to the terminal 36, in synchronization with the shift pulses of the vertical shift register. In this manner the junction between the base and the emitter, which are both in the floating state, is forward biased, and the amplified photoelectric signals in the capacitance 24 are read as voltages.

Embodiment 2

Figure 3:
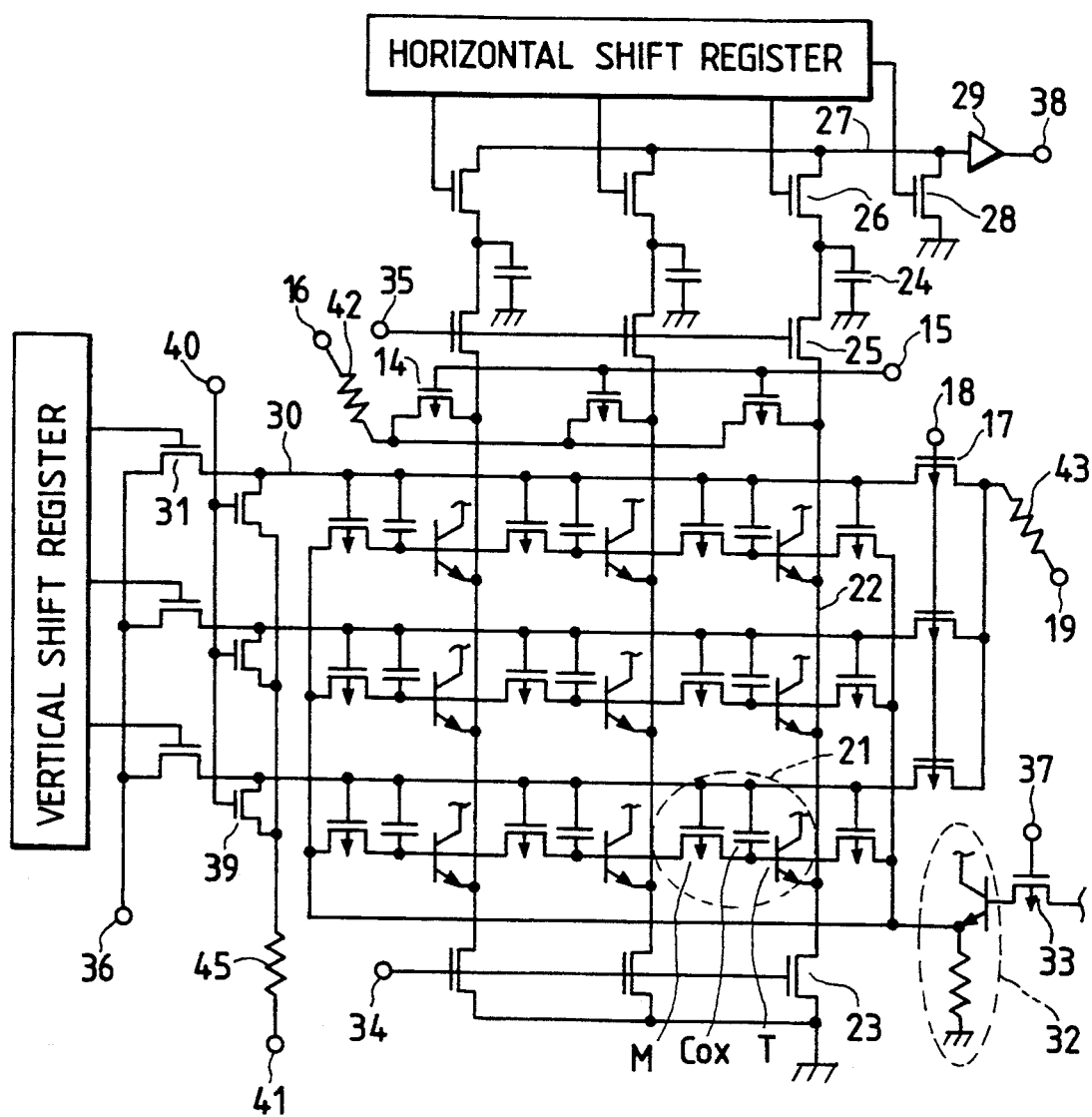
FIG. 3 is an equivalent circuit diagram of a second embodiment of the solid-state image pickup device of the present invention.

FIG. 3 is an equivalent circuit diagram of a second embodiment of the solid-state image pickup device of the present invention, wherein the same components as in FIG. 1 are represented by the same symbols and will not be explained further. In FIG. 3 there are shown a resistor 42 connecting the sources of the MOS transistors 14 and the power supply terminal 16; a resistor 43 connecting the MOS transistors 17 and the power supply terminal 19; and a resistor 45 connecting the sources of the MOS transistors 39 and the power supply terminal 41.

The addition of the resistors 42, 43 45 provides the following effect. If the potentials of the vertical output lines 22 and the horizontal drive lines 30 are rapidly raised in the start of the accumulating period, the potential difference therebetween becomes larger with a small time difference as the rising time becomes shorter, so that the margin in the driving timing has to be made smaller. For example, if the horizontal drive lines 30 are close to the high level potential while the vertical output lines 22 are close to the ground potential, the bipolar sensors of the pixels are turned on to generate base currents. On the other hand, if the vertical output lines 22 are close to the high level potential while the horizontal drive lines 30 are close to the ground potential, the base potentials are elevated whereby the p-MOS transistors M between the pixels are turned on to generate leak currents among the pixels. Also similar phenomena will appear at the end of the accumulating period, if the potentials of the vertical output lines 22 and the horizontal drive lines 30 are lowered within a short time. Such increase or decrease of holes in the base areas has to be avoided, as it can be observed as noise.

Figure 4:
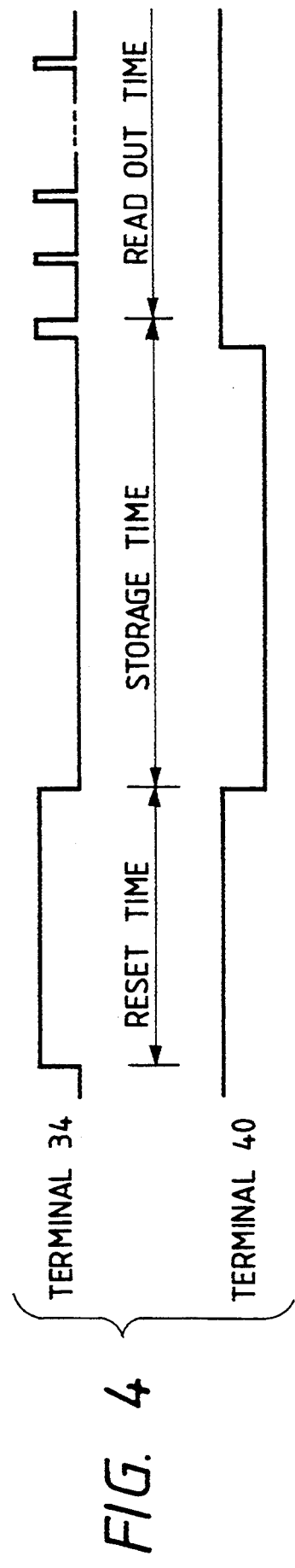
FIG. 4 is a timing chart showing pulses required for driving the solid-state image pickup device of said second embodiment.

In the present embodiment, the presence of the resistors in the power supply for increasing the time constants realizes slower upshift and downshift of the potentials of the vertical output lines 22 and the horizontal drive lines 30, so that the difference of the potentials does not become large even with a slight difference in the driving time. Consequently the margin in the drive timing can be made larger. At the downshift of the potential of the vertical output lines 22, by delaying the pulse to the terminal 34 in comparison with that to the terminal 40 as shown in FIG. 4, the resetting MOS transistors 23 which do not have the resistor in the power supply are turned on later than the MOS transistors 39, so that the enlargement in the potential difference can be prevented.

Besides, if the resistance of the resistor 45 is made sufficiently larger than the on-reistance of the buffer MOS transistors 31, the read-out operation can be achieved while the terminal 40 is given a high level pulse, namely while the MOS transistors 39 are turned on, and the reset pulse supplied to the terminal 36 can be applied to the sensors.

In the first embodiment, since the horizontal drive lines are in a floating state, except for those on the selected row, crosstalk may result due to the deviations of the potentials of such horizontal drive lines by the capacitative coupling, but such signal crosstalk can be prevented in the present embodiment since the potentials of all the horizontal drive lines 30 are fixed at the resetting.

Embodiment 3

Figure 5:
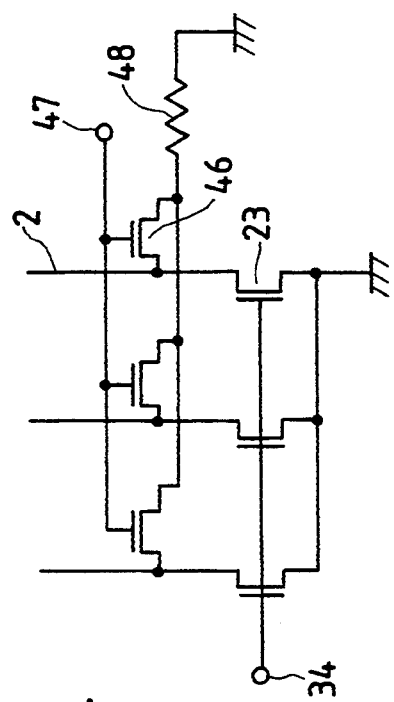
FIG. 5 is a circuit diagram of a third embodiment of the solid-state image pickup device of the present invention.

FIG. 5 is a partial circuit diagram of a third embodiment of the solid-state image pickup device of the present invention, wherein all the components, except those explained in the following, are same as those in the second embodiment shown in FIG. 3. In the present embodiment there are provided MOS transistors 46 for controlling the potentials of the vertical output lines 22; a terminal 47 for applying a pulse to the gates of the MOS transistors 46; and a resistor 48 grounding the sources of the MOS transistors 46. The pulse supplied to the terminal 47 is shifted up simultaneously with the pulse supplied to the terminal 40, in order that the MOS transistors 46, instead of the MOS transistors 23, shift the vertical output lines 22 to the ground potential prior to the end of the accumulating operation. Other functions are the same as those in the second embodiment.

Embodiment 4

If the sensor is irradiated with strong light during the accumulating operation, the base potential is elevated to generate a forward bias state between the base and the emitter or the collector. Such forward bias state between the base and the collector induces injection of holes into the collector and flow of such holes into the bases of other pixels. This is known as the blooming phenomenon. In order to prevent this phenomenon, in the present embodiment, the potential of the terminal 16 is selected slightly lower, for example by 0.5 V, than the collector potential. In this manner, when the sensor is irradiated by strong light, the excessive holes are made to flow into the emitter instead of the collector. The sensors are driven in the same manner as in the 1st to 3rd embodiments.

Embodiment 5

Figure 6:
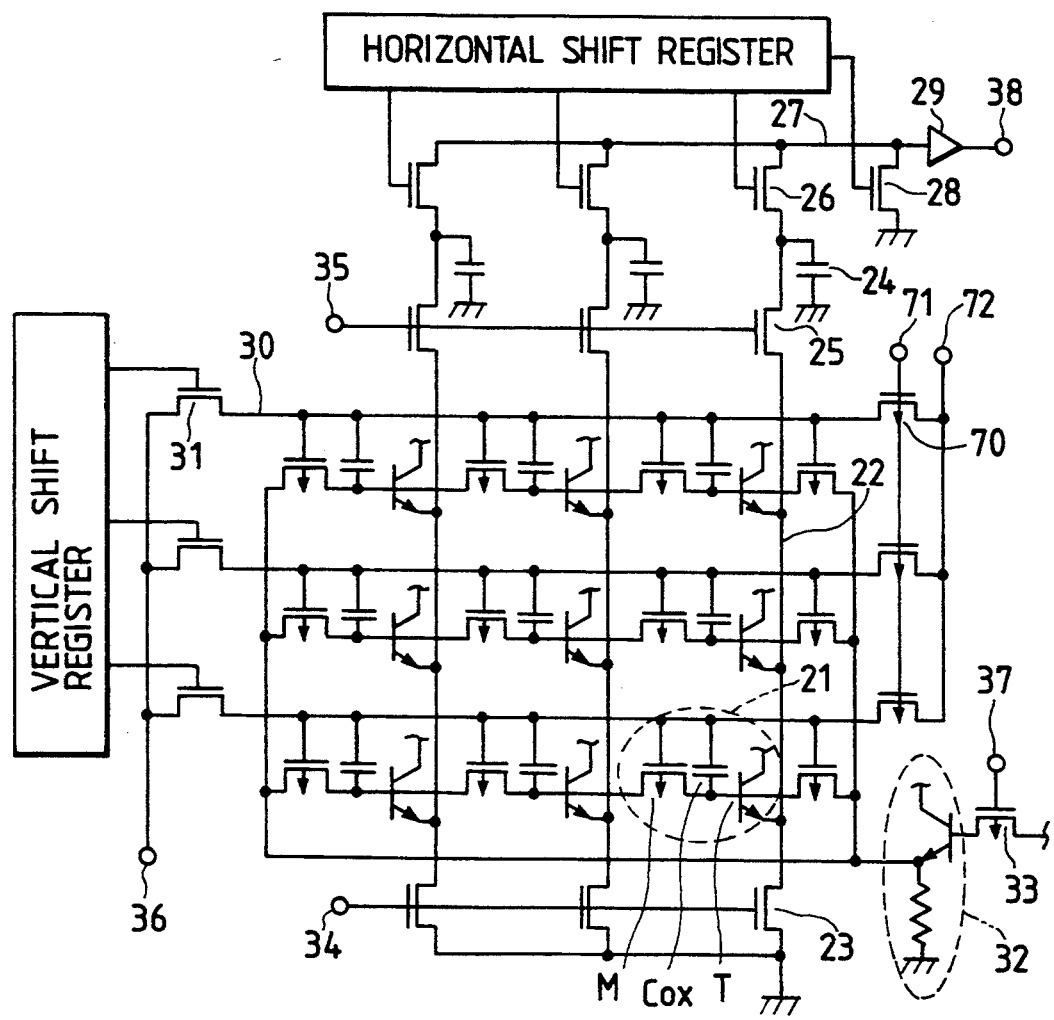
FIG. 6 is an equivalent circuit diagram of a fifth embodiment of the solid-state image pickup device of the present invention.

FIG. 6 is an equivalent circuit diagram of a 5th embodiment of the solid-state image pickup device of the present invention. In the 1st to 4th embodiments, the potentials of the horizontal drive lines 30 and the vertical output lines 22 are elevated in the accumulating operation to elevate the gate potential, thereby reducing the potential difference between the gate area and the collector area. On the other hand, in the present embodiment, voltages of three levels, to be explained later, are applied to the horizontal drive lines for effecting the resetting, and, at the end thereof, the gate potential is set at a high level and is maintained at this level during the accumulating period, thereby reducing the potential difference between the gate area and the collector area in the accumulating operation.

Figure 7:
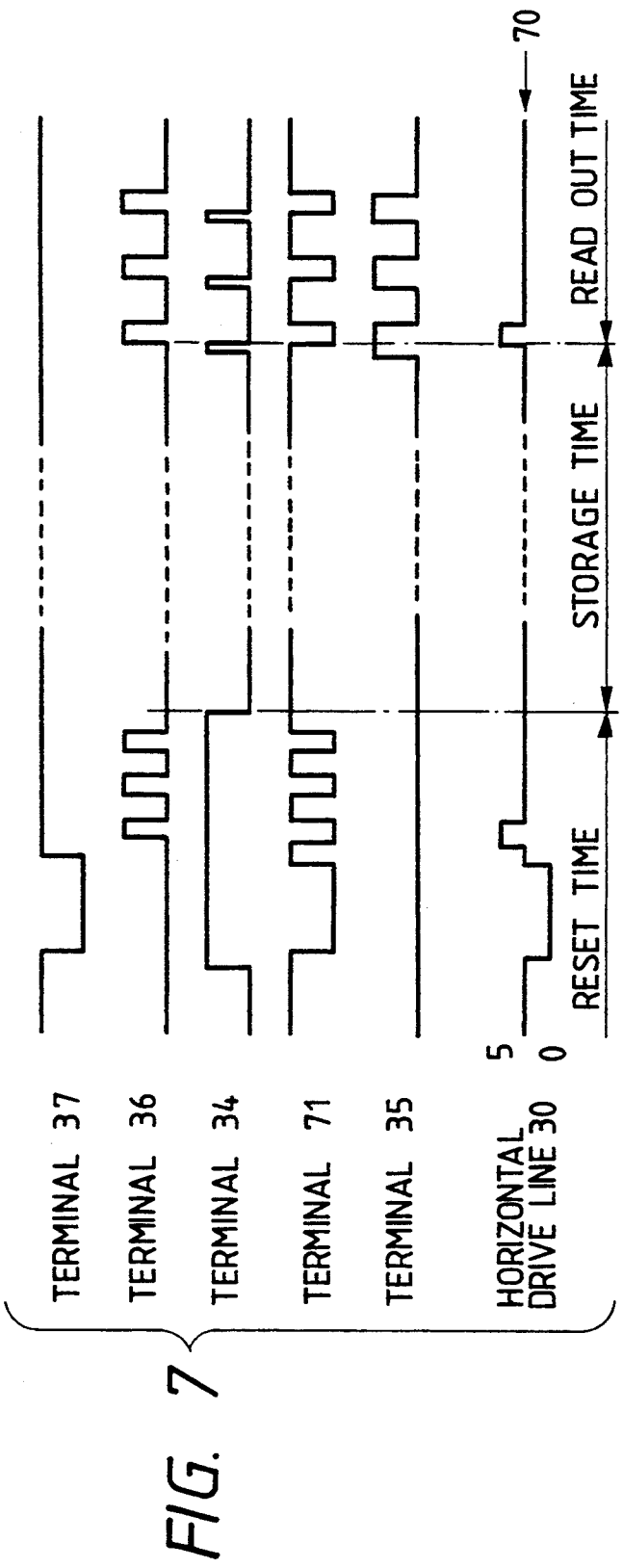
FIG. 7 is a timing chart showing pulses required for driving the solid-state image pickup device of said fifth embodiment.
Figure 19:
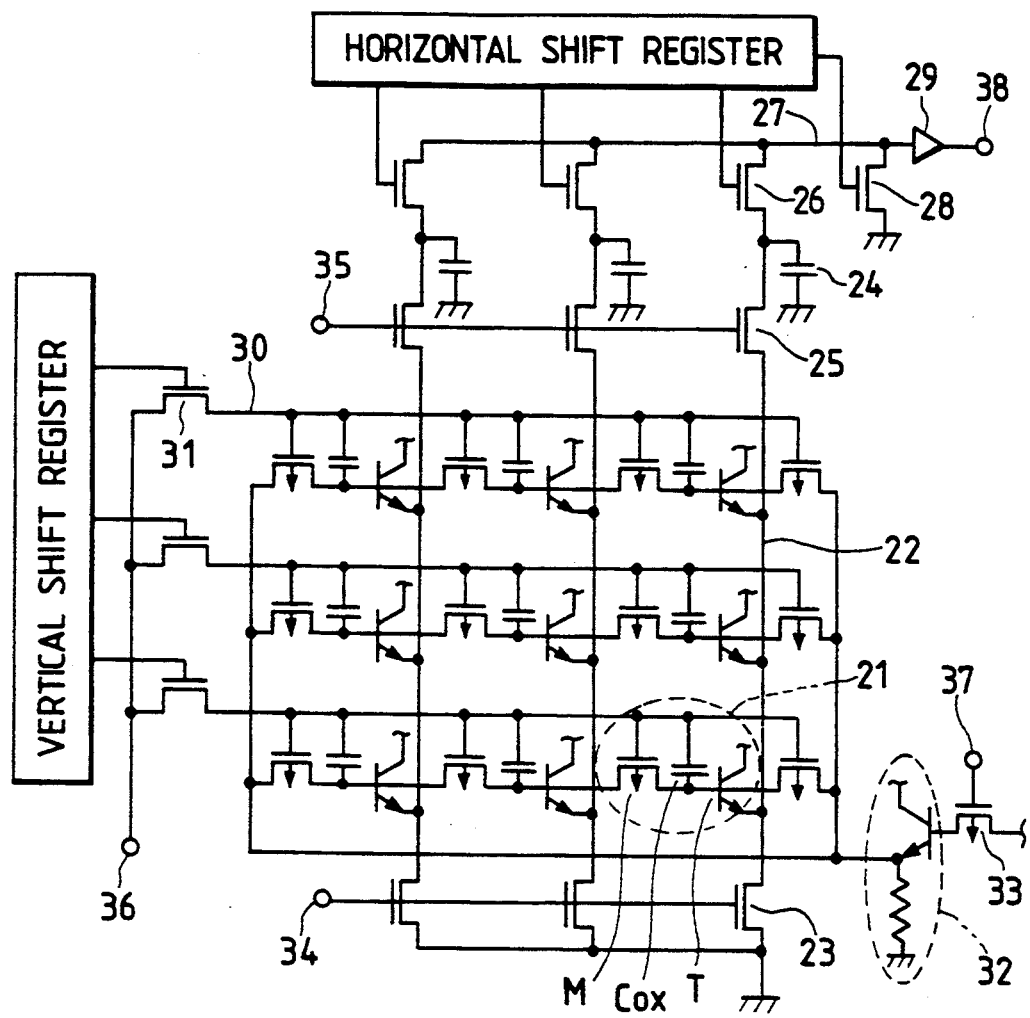
FIG. 19 is an equivalent circuit diagram of a two-dimensional solid-state image pickup device composed of a two-dimensional array of the pixels.
Figure 20:
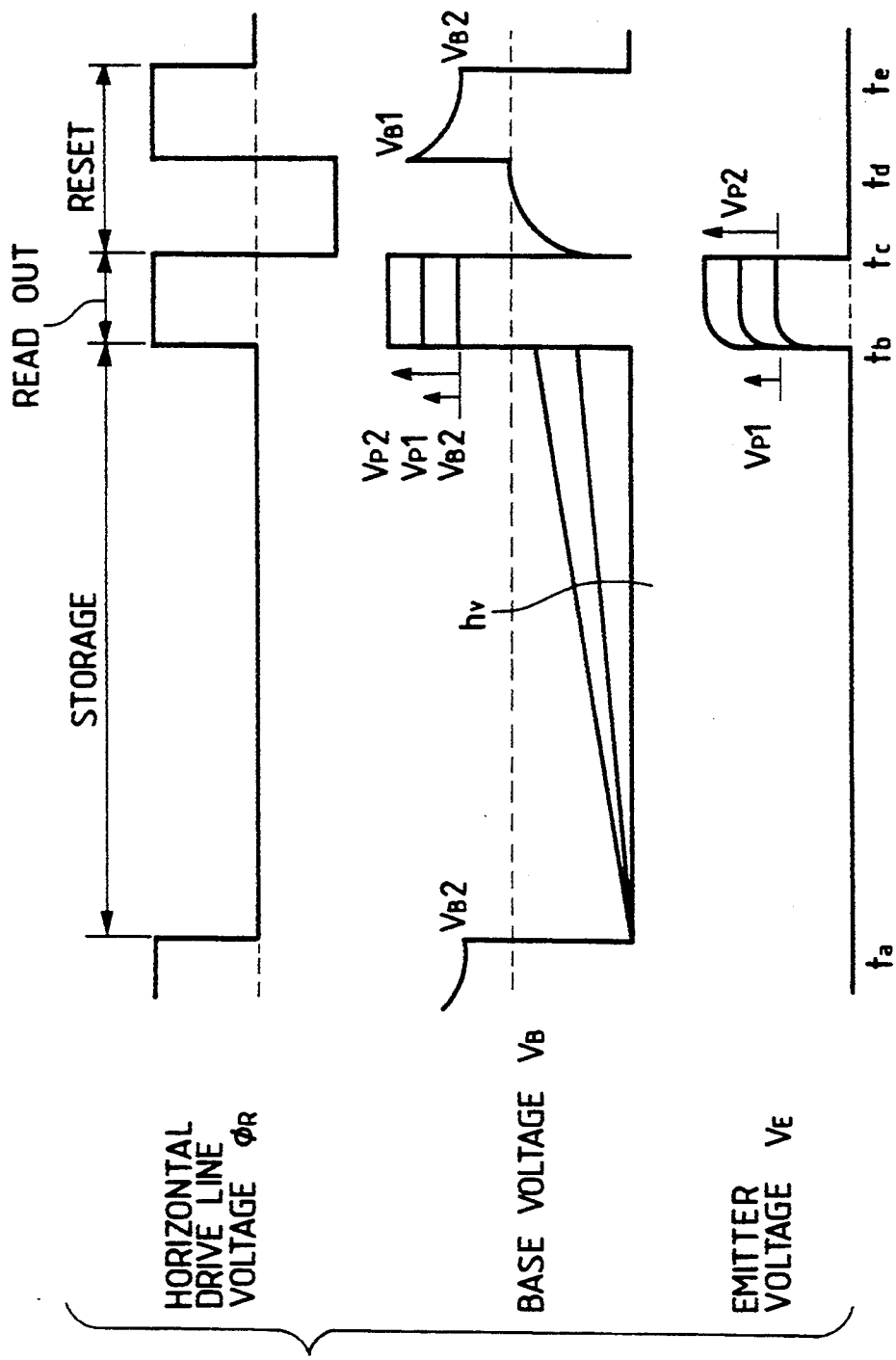
FIG. 20 is a chart showing variations in various potentials in various operations of the bipolar sensor.

In comparison with the configuration shown in FIG. 19, the present embodiment has a MOS transistor 70 constituting switch means on each horizontal drive line 30. Thus each horizontal drive line 30 is given a low- or high-level voltage through the MOS transistor 31, and is given a medium-level voltage through said MOS transistor 70. The functions of this embodiment will be explained in the following, with reference to a timing chart shown in FIG. 7.

The resetting, accumulating and read-out operations are similar to those in the foregoing embodiments, but, in the present embodiment, the resetting is executed by controlling the base potential by the voltages of three levels, namely the low- and high-level voltages supplied to the terminal 36 and the medium-level voltage supplied to the terminal 72, and, at the end of the resetting, the horizontal drive lines 30 are set at the medium-level voltage. Then the terminal 71 is shifted to the high level potential to turn on the MOS transistors 70 during the accumulating period, thereby maintaining the horizontal drive lines 30 at said medium-level potential.

Consequently, by maintaining the terminal 72, for example, at $V_{cc}/2$, it is possible to set a high base potential and to set the base-collector inverse bias voltage in the bipolar transistors of the pixels smaller than in the prior art, at the end of the second resetting. As a result, the width of the depletion layer between the base and the collector during the accumulating period can be made smaller than in the prior art, and the fixed pattern noise based on the dark current can be reduced.

Embodiment 6

Figure 8:
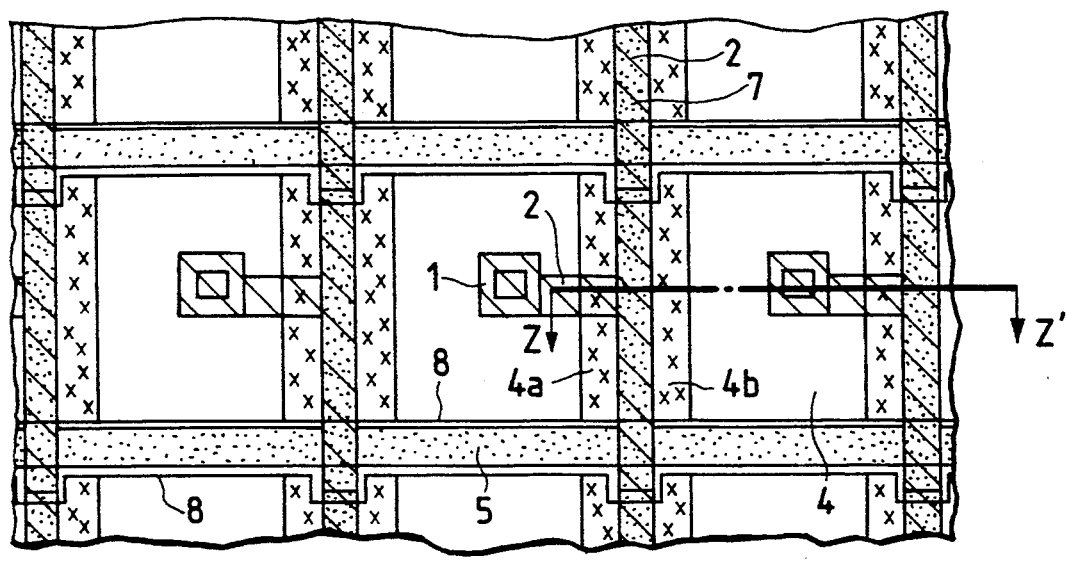
FIG. 8 is a plan view of a sixth embodiment of the solid-state image pickup device of the present invention.
Figure 9:
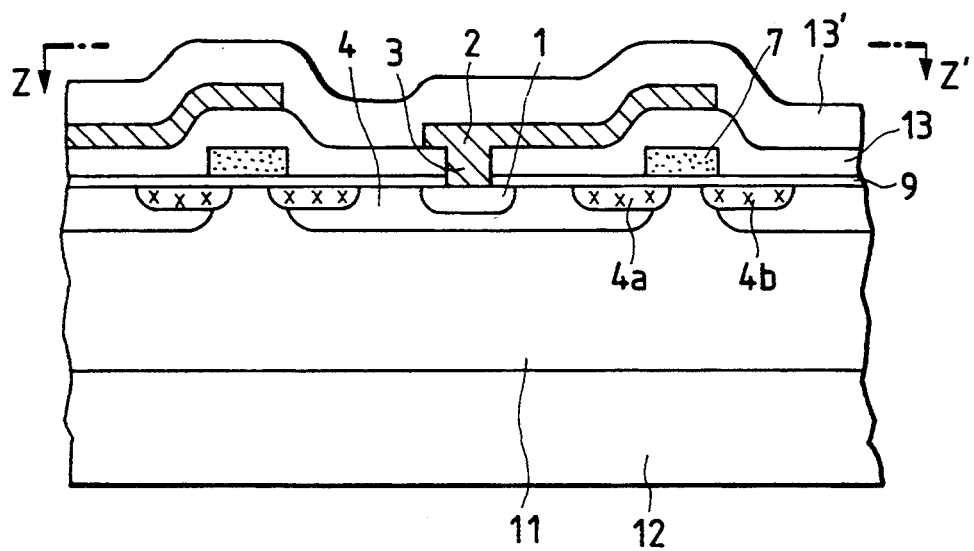
FIG. 9 is a cross-sectional view along a line Z-Z' in FIG. 8.
Figure 16:
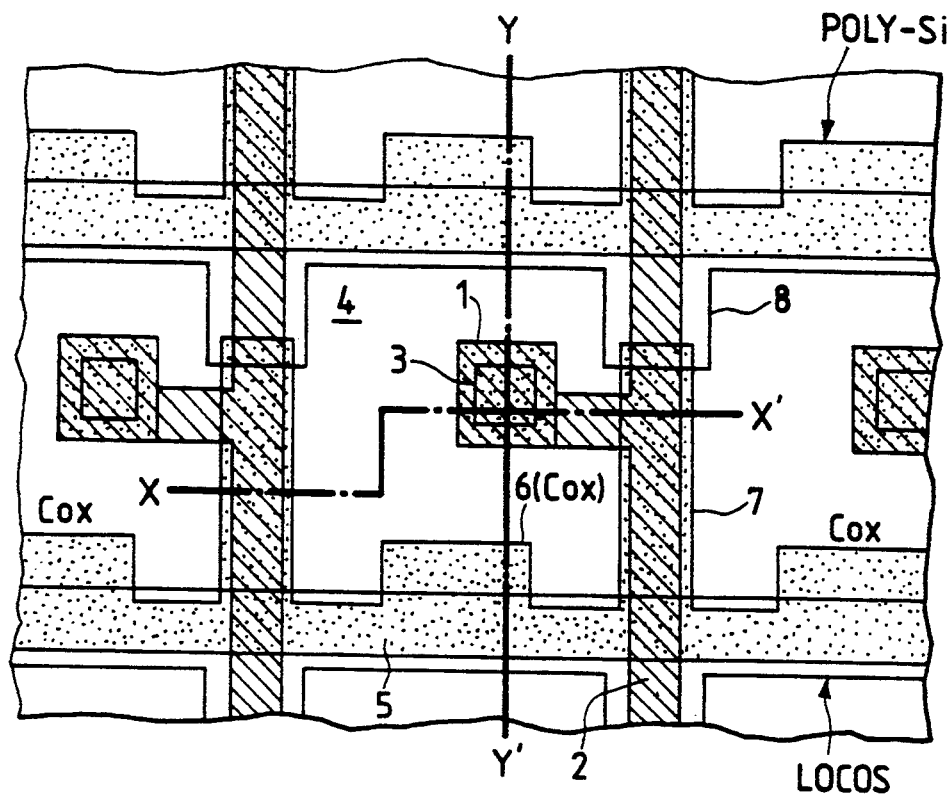
FIG. 16 is a plan view of a pixel employing a conventional bipolar sensor.
Figure 17:
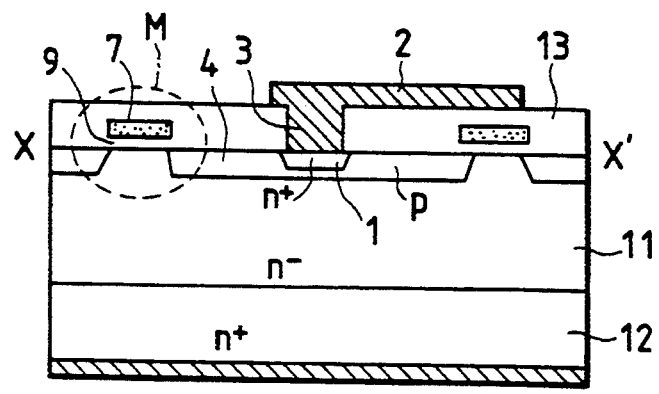
FIG. 17 is a cross-sectional view along a line X-X' in FIG. 16.
Figure 18:
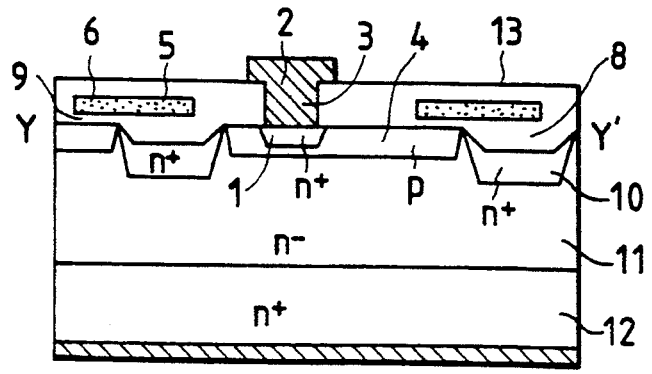
FIG. 18 is a cross-sectional view along a line Y-Y' in FIG. 16.

FIG. 8 is a plan view of a pixel of a 6th embodiment of the solid-state image pickup device of the present invention, and FIG. 9 is a cross-sectional view of the device shown in FIG. 8. In these drawings, the same components as those in FIGS. 16 to 18 are represented by the same symbols.

In FIGS. 8 and 9, there are shown an n+ emitter area 1 constituting a main electrode area; an Al wiring 2 constituting an emitter output line and a vertical output line; a contact hole 3 connecting the emitter area 1 with the Al wiring 2; a p-base area constituting a control electrode area; p+-areas 4a, 4b of a high impurity concentration, constituting parts of control electrode areas and serving as source and drain areas of a p-MOS transistor; a drive line 5 composed for example of polysilicon for effecting the sensor operation of the pixel; a polysilicon electrode 7 constituting the gate of the p-MOS transistor and composed of a part of the drive line 5, receiving a three-level signal; a SiO2 layer 9 composed of a gate oxide film; an n− epitaxial layer 11 constituting a part of the collector area; a Si substrate 12 constituting the collector area; an interlayer insulation film 13; and a surface protective film 13'.

Figure 10:
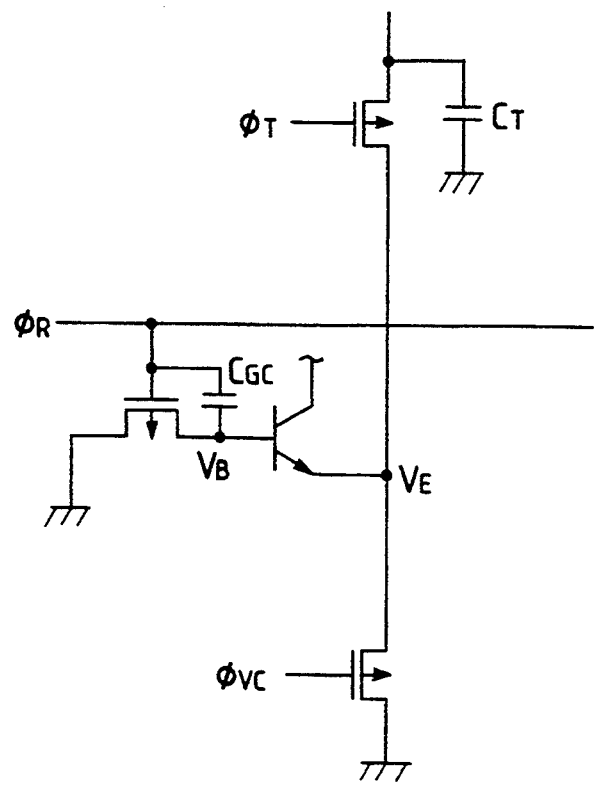
FIG. 10 is an equivalent circuit diagram of said sixth embodiment.

The most significant feature of the present embodiment lies in fact that the polysilicon wiring 5 is formed on the element isolating area 8, and that the capacitance $C_{OX}$ of the polysilicon gate MOS transistor conventionally formed on the p-base area 4 is dispensed with and is functionally replaced by a capacitance $C_{GC}$ formed by a polysilicon electrode 7 and p+-areas 4a, 4b. FIG. 10 is an equivalent circuit diagram of the present embodiment, and FIG. 11 is a cross-sectional view of the p-MOS transistor forming said capacitance $C_{GC}$.

Figure 11:
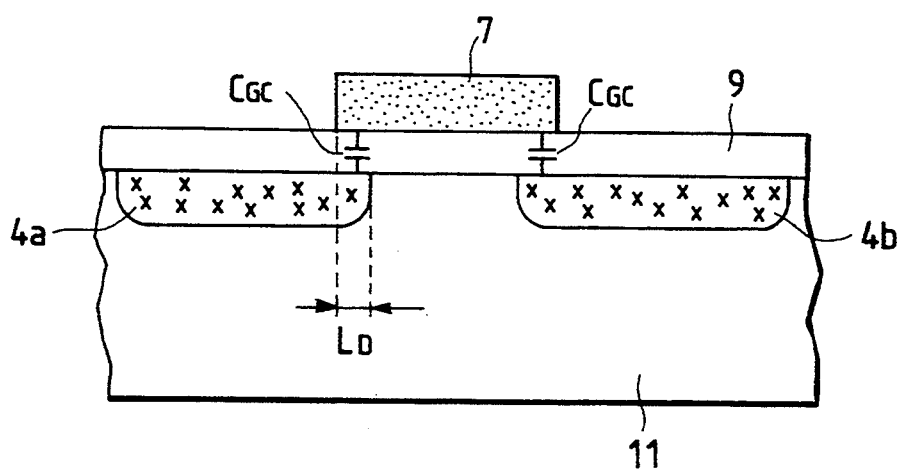
FIG. 11 is a schematic cross-sectional view of a p-MOS transistor constituting the capacitance $C_{GC}$.

As shown in FIGS. 10 and 11, the gate-base capacitance $C_{GC}$ of the p-MOS transistor is utilized for elevating the base potential to the positive side, at the read-out and resetting operations. The variation in the base potential is represented by:

$$V_{B1} = C_{GC}/(C_{GC} + C_{BC} + C_{BE}) \times V_R$$

wherein $C_{BC}$ is the base-collector capacitance, $C_{BE}$ is the base-emitter capacitance, and $V_R$ is the amplitude voltage of $\phi_R$.

The p+ source and drain areas 4a, 4b shown in FIG. 11 are formed by self-aligned steps with respect to the polysilicon gate 7, and are diffused to below the gate by a subsequent heating step. Consequently the overlapping capacitances between the polysilicon electrode and the two p+ areas 4a, 4b are mutually equal. For a diffusion length $L_D$, $C_{GC}$ can be represented by:

$$C_{GC} = \epsilon_{OX} L_D W / t_{OX}$$

wherein $\epsilon_{OX}$ is the dielectric constant of the gate oxide film, W is the gate length, and $t_{OX}$ is the thickness of the gate oxide film.

Since the capacitance $C_{GC}$ is formed solely by the overlapping capacitance obtained by self alignment, the fluctuation in the capacitance among different pixels is reduced in comparison with that in the conventional configuration, whereby the fluctuations in the sensitivity and in the saturated voltage, and the fixed pattern noise can be reduced. Also the absence of polysilicon on the base area improves the sensitivity to blue light and to reduces the dark current. Consequently the present embodiment can provide a photoelectric converting device with a reduced noise level, a higher sensitivity and an improved S/N ratio.

Embodiment 7

Figure 12:
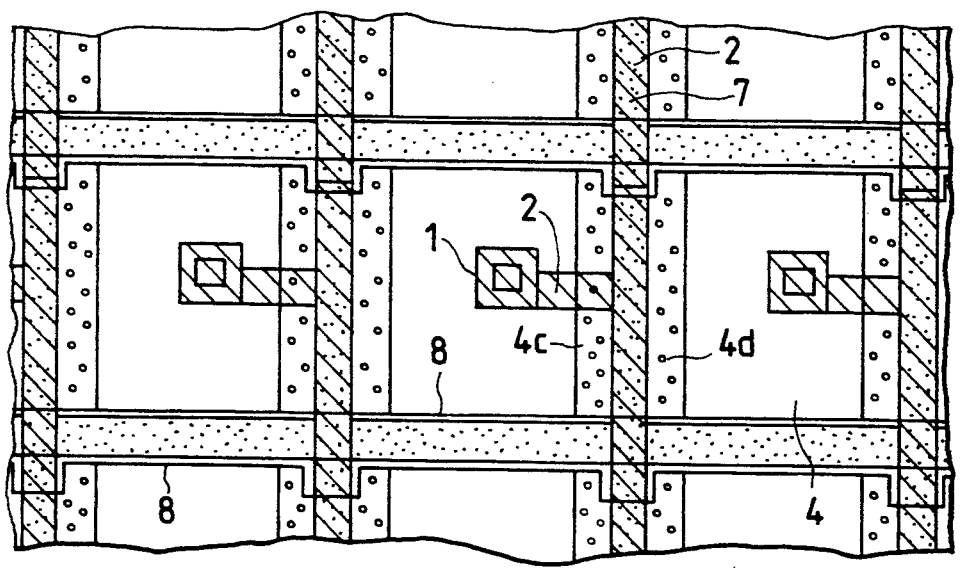
FIG. 12 is a plan view of a seventh embodiment of the solid-state image pickup device of the present invention.

FIG. 12 is a plan view of a 7th embodiment of the solid-state image pickup device of the present invention, wherein the same components as those in the 1st embodiment are represented by the same symbols, and will not be explained further. In FIG. 12, 4c, 4d indicate p−-areas constituting source and drain. In contrast to the 1st embodiment employing p+ source and drain areas of a high impurity concentration, the present embodiment employs p− areas of a low impurity concentration. Because of use of such p− areas, the source-drain areas under the gate become depleted, whereby the capacitance $C_{GC}$, represented by the following equation, becomes smaller than in the 1st embodiment:

$$C_{GC} = \{t_{OX}/(\epsilon_{OX} L_D W) + W_S/(\epsilon_S L_D W)\}^{-1}$$

wherein $W_S$ is the width of the depletion layer, and $\epsilon_S$ is the dielectric constant of silicon.

The present embodiment enables a further increase in the sensitivity by reduction of the base capacitance. It however is effective in case a large saturation voltage is not required, since the saturation voltage becomes smaller.

Embodiment 8

Figure 13:
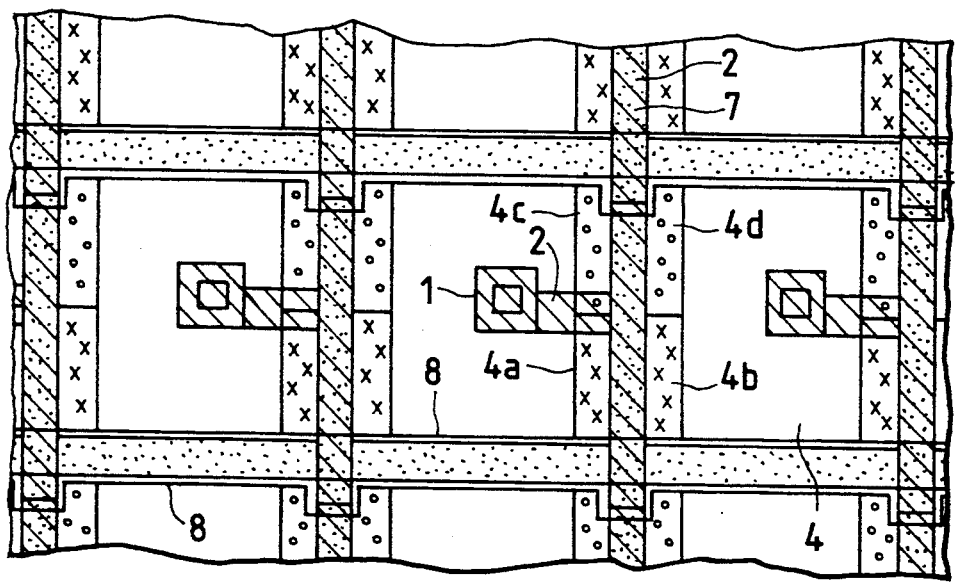
FIG. 13 is a plan view of an eighth embodiment of the solid-state image pickup device of the present invention.

FIG. 13 is a plan view of an 8th embodiment of the solid-state image pickup device of the present invention, wherein same components as those in the 1st and 2nd embodiments are represented by same symbols.

The present embodiment employs, in the source and drain areas of the p-MOS transistor, p+-areas 4a, 4b of a high impurity concentration and p−-areas 4c, 4d of a low impurity concentration in mixed manner, thereby reducing the capacitance $C_{GC}$.

In the present embodiment, the gate-base capacitance $C_{GC}$ can be arbitrarily varied by a change in the proportion of the p+ areas 4a, 4b and the p− areas 4c, 4d.

Embodiment 9

Figure 14:
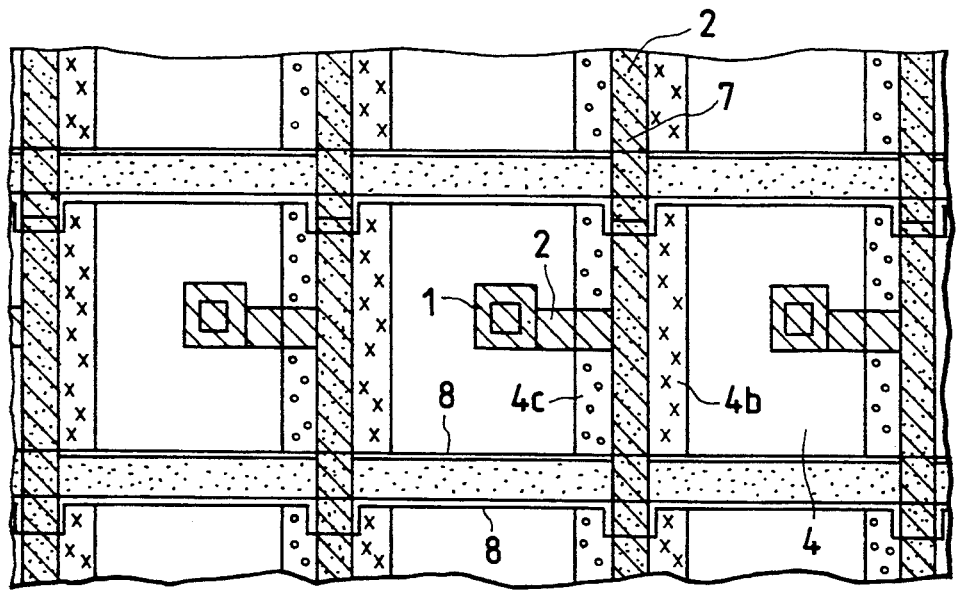
FIG. 14 is a plan view of a ninth embodiment of the solid-state image pickup device of the present invention.

FIG. 14 is a plan view of a 9th embodiment of the solid-state image pickup device of the present invention, wherein the same components as those in the 1st and 2nd embodiments are represented by the same symbols.

In this embodiment, the impurity concentrations in the source and drain areas of the p-MOS transistors at the left and right sides of the pixel are made different. More specifically, a p− area 4c of low impurity concentration and a p+ area 4b of high impurity concentration are employed as the source and drain areas of the p-MOS transistor. Also the present embodiment can reduce the gate-base capacitance $C_{GC}$.

Embodiment 10

Figure 15:
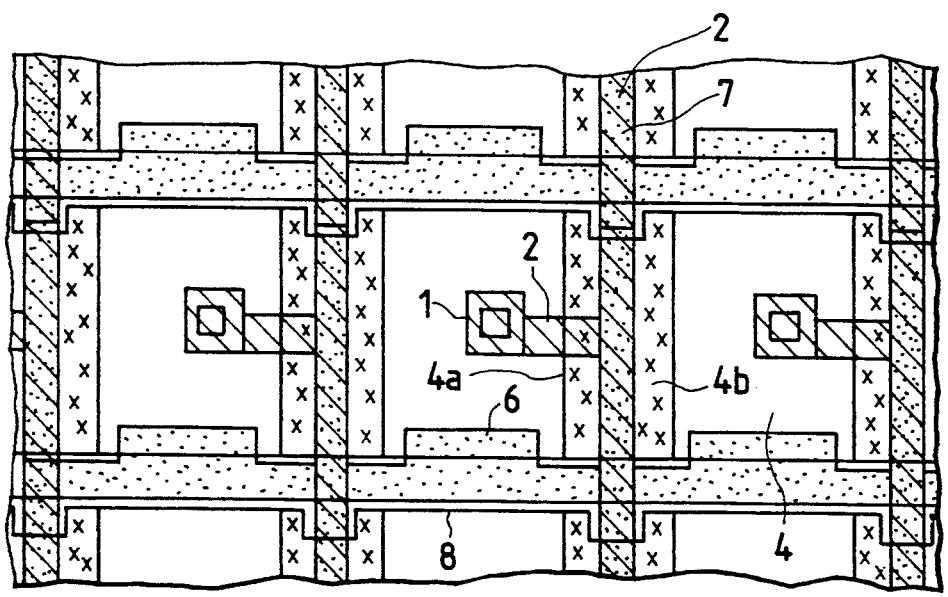
FIG. 15 is a plan view of a tenth embodiment of the solid-state image pickup device of the present invention.

FIG. 15 is a plan view of a 10th embodiment of the solid-state image pickup device of the present invention, wherein the same components as those in the 1st and 2nd embodiments are represented by the same symbols and will be omitted from the following description.

In this embodiment, there are provided both the gate-base capacitance $C_{GC}$ and the capacitance $C_{OX}$ by the polysilicon gate MOS transistor.

In this embodiment, the inverse bias amount $V_{B1}$ is given by:

$$V_{B1} = (C_{GC}+C_{OX})/(C_{GC}+C_{OX}+C_{BC}+C_{BE}) \times V_R$$

and this embodiment is effective when a high saturation voltage is required.

As explained in the foregoing, the 1st to 5th embodiments are to elevate the potential of the control electrode area to reduce the potential difference between said control electrode area and the second main electrode area, thereby suppressing the dark current inducing the fixed pattern noise and realizing a photoelectric converting device of a high S/N ratio. The present invention, when applied to a solid-state image pickup device, not only provides a high S/N ratio but also suppresses crosstalk and blooming.

Also the 6th to 10th embodiments form a gate-insulated transistor by providing a control electrode, across an insulating film, on a semiconductor area between two control electrode areas of the adjacent photo-electric converting elements, also forming a capacitive coupling between the control electrode and at least one of the two control electrode areas and controlling the potential of the control electrode area through the potential control of the control electrode. This configuration allows the capacitance $C_{OX}$, conventionally provided on the control electrode area, to be eliminated, thus improving sensitivity, and reducing dark current and fixed pattern noise.

Figure 21:
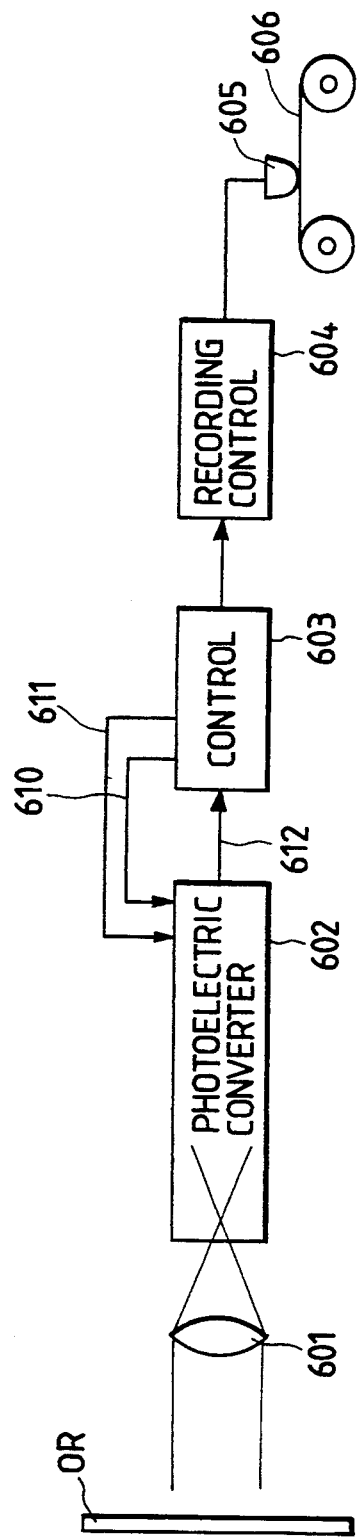
FIG. 21 is a block diagram of a signal processing system employing the photoelectric converting device of the present invention.

FIG. 21 is a block diagram of a signal processing system such as a communication system, a facsimile or a video recorder, employing the photoelectric converting device of the present invention, wherein shown are an original OR, bearing image information; an imaging lens 601; and a photoelectric converting device 602 of the present invention.

The device can be of a simple device structure in case of the simple communication system, or of a line sensor in case of the facsimile, or an area sensor in case of the video recorder.

A control circuit 603 including a central processing unit is connected to the device 602 through an input line 612, an output line 610 for driving said device 612, and a power supply line 611.

A recording control circuit 604 is connected to a recording head 605 for recording information on a recording medium 606.

The recording head 605 is a magnetic head in case of the video recorder, or a thermal head or an ink jet head for discharging ink by thermal energy, in case of the facsimile.

In the case of a communication system, the recording head 605 may be replaced by a recording unit positioned in another location and connected through a cable.

What is claimed is:

1. A photoelectric converting device provided with a transistor comprising a control electrode region of a first conductivity type semiconductor material, and first and second main electrode regions of a second, different conductivity type semiconductor material, said photoelectric converting device for performing a storage operation to store photocarriers in the control electrode region, for reading out a signal from the first main electrode region and for resetting a potential at the control electrode region, said photoelectric converting device comprising:

a first switching means for applying a first power supply voltage to an output line, the said first power supply voltage being a first reference potential and being applied to the first main electrode region during the storage operation; and a second switching means for applying, simultaneously with the application of the first reference potential to the first main electrode by said first switching means, a second power supply voltage, said second power supply voltage being applied to a drive line, the said second power supply voltage being a second reference potential and being applied to the control electrode region, wherein a potential difference between said second main electrode region and said control electrode region and a potential difference between said first and second main electrode regions are reduced.

2. A photoelectric converting device provided with a plurality of photoelectric converting cells, each cell including a first semiconductor area of a first conductive type, a second semiconductor area of a second conductive type, and an electrode serving as a drive line provided in an area between at least two adjacent first semiconductor areas, said electrode adapted to receive a signal of at least three voltage levels;

wherein said electrode and said at least two adjacent first semiconductor areas are self aligned such that the said electrode overlaps a substantially equal portion of at least two said adjacent first semiconductor areas to define an aligned part with each said first semiconductor area, so that an overlapping capacitance is formed by said aligned part only, and wherein the overlapping capacitance is utilized for controlling potential of said first semiconductor area so as to effect accumulation, read-out and resetting operations.

* * * * *

UNITED STATES PATENT AND TRADEMARK OFFICE
CERTIFICATE OF CORRECTION

PATENT NO. : 5,406,332

DATED : April 11, 1995

INVENTOR(S) : MAHITO SHINOHARA, ET AL.

It is certified that error appears in the above-identified patent and that said Letters Patent is hereby corrected as shown below:

COLUMN 2

Line 45, "resetting" should read --resetting:--.

COLUMN 4

Line 46, "said" should read --the--.
   Line 53, "said-first" should read --the first--.

COLUMN 5

Line 8, "said" should read --the--.
   Line 9, "said" should read --the--.
   Line 18, "said" should read --the--.

COLUMN 8

Line 43, "terminal" should read --terminals--.

COLUMN 10

Line 6, "on-reistance" should read --on-resistance--.

UNITED STATES PATENT AND TRADEMARK OFFICE
CERTIFICATE OF CORRECTION

PATENT NO. : 5,406,332
DATED      : April 11, 1995
INVENTOR(S) : MAHITO SHINOHARA, ET AL.

It is certified that error appears in the above-identified patent and that said Letters Patent is hereby corrected as shown below:

COLUMN 14

Line 56, "self aligned" should read --self-aligned--.
   Line 64, "potential" should read --a potential--.

Signed and Sealed this

Eleventh Day of July, 1995

Attest:

BRUCE LEHMAN

Attesting Officer     Commissioner of Patents and Trademarks